(12) United States Patent
Poulose et al.

(10) Patent No.: US 11,514,797 B2
(45) Date of Patent: Nov. 29, 2022

(54) LRUS AND RELATED NIGHT VISION DISPLAY HARMONIZATION METHODS

(71) Applicant: HONEYWELL INTERNATIONAL INC., Morris Plains, NJ (US)

(72) Inventors: Ezekiel Poulose, Bangalore (IN); Sunit Saxena, Bangalore (IN); Anita Sure, Bangalore (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 550 days.

(21) Appl. No.: 16/563,660

(22) Filed: Sep. 6, 2019

(65) Prior Publication Data

US 2020/0394925 A1  Dec. 17, 2020

(30) Foreign Application Priority Data

Jun. 12, 2019 (IN) .............................. 201941023368

(51) Int. Cl.

| | |
|---|---|
| *G08G 5/00* | (2006.01) |
| *G02B 27/01* | (2006.01) |
| *G11C 7/10* | (2006.01) |
| *G01S 13/933* | (2020.01) |
| *G02B 23/12* | (2006.01) |
| *H04N 5/57* | (2006.01) |

(52) U.S. Cl.
CPC .......... *G08G 5/0008* (2013.01); *G01S 13/933* (2020.01); *G02B 23/12* (2013.01); *G02B 27/01* (2013.01); *G08G 5/0021* (2013.01); *G08G 5/0052* (2013.01); *G11C 7/1093* (2013.01); *H04N 5/57* (2013.01); *B60R 2300/106* (2013.01); *G02B 2027/0118* (2013.01); *G09G 2320/0693* (2013.01)

(58) Field of Classification Search
CPC ......................... H04N 5/57; G09G 2320/0693
See application file for complete search history.

(56) References Cited

U.S. PATENT DOCUMENTS

| | | | |
|---|---|---|---|
| 5,428,265 A | 6/1995 | Booth, Jr. et al. | |
| 6,590,560 B1 * | 7/2003 | Lucas | ................... G09G 3/3406 250/214 AG |
| 7,492,356 B1 | 2/2009 | Pruitt | |
| (Continued) | | | |

FOREIGN PATENT DOCUMENTS

| | | |
|---|---|---|
| CN | 103903590 A | 7/2014 |
| CN | 103903592 A | 7/2014 |
| CN | 104637452 A | 5/2015 |

*Primary Examiner* — William A Beutel
(74) *Attorney, Agent, or Firm* — Lorenz & Kopf, LLP

(57) ABSTRACT

Methods, devices and systems are provided for harmonizing output display characteristics of one component with those of other components onboard a vehicle, such as an aircraft. A line-replaceable unit (LRU) suitable includes a display driver to be coupled to a display command bus, a data storage element to maintain calibration information for the display driver, and a control module coupled to the display driver and the data storage element to identify a current state of an input command signal from the display command bus, identify an adjustment for the display driver based on the calibration information using the current state of the input command signal, and automatically operate the display driver in accordance with the adjustment.

20 Claims, 2 Drawing Sheets

(56) References Cited

U.S. PATENT DOCUMENTS

| | | | |
|---|---|---|---|
| 8,655,068 B1* | 2/2014 | Li | H04N 1/00031 |
| | | | 382/128 |
| 8,786,642 B2 | 7/2014 | Chang et al. | |
| 2011/0122168 A1* | 5/2011 | Lee | G09G 3/3426 |
| | | | 345/102 |
| 2011/0273316 A1 | 11/2011 | Chabot | |
| 2013/0049608 A1* | 2/2013 | Tatavoosian | H05B 41/3927 |
| | | | 315/154 |
| 2013/0249404 A1* | 9/2013 | Eckel | H05B 45/20 |
| | | | 315/113 |
| 2016/0267722 A1* | 9/2016 | Schroeder | G07C 5/008 |

* cited by examiner

LRUS AND RELATED NIGHT VISION DISPLAY HARMONIZATION METHODS

CROSS-REFERENCE TO RELATED APPLICATION(S)

This application claims the benefit of India Patent Application No. 201941023368, filed Jun. 12, 2019, the entire contents of which are incorporated by reference herein.

TECHNICAL FIELD

The subject matter described herein relates generally to vehicle systems, and more particularly, embodiments of the subject matter relate to harmonizing onboard displays for night vision operations.

BACKGROUND

Modern vehicles often include a multiple displays for presenting information to a vehicle operator. For example, flight deck displays (or cockpit displays) for an aircraft may include primary flight displays (PFDs), multifunction displays, lateral map displays, synthetic vision displays, and the like, in addition to any number of electronic flight instrument displays. Often, these displays are provided using line replaceable units (LRUs), which may vary from aircraft to aircraft depending on operator preferences. Depending on the particular configuration, the onboard LRUs may be provided by different manufacturers and exhibit different performance characteristics with respect to one another. Additionally, LRUs may be updated or replaced over time, such that newer LRUs may utilize different technologies or hardware than older legacy LRUs previously onboard the aircraft. The potential performance variations across onboard display LRUs complicates cockpit integration and fleet management for night vision operation when using a common control signal across all display LRUs. Accordingly, it is desirable to provide methods and systems for harmonizing display characteristics across LRUs in a manner that reduces the time or manual overhead required and does not require additional hardware components. Other desirable features and characteristics will become apparent from the subsequent detailed description and the appended claims, taken in conjunction with the accompanying drawings and this background.

BRIEF SUMMARY

Methods, devices and systems are provided for harmonizing a display characteristic of a component onboard a vehicle with other components onboard the vehicle coupled to a common command bus. An exemplary method involves obtaining adjustments for achieving a desired behavior for the display characteristic at different states of a display command input to the component from the common command bus, resulting in a plurality of data points maintaining associations between a respective adjustment and a respective state for the display command input, determining calibration information for a range of the display command input based on relationships between the adjustments and the different states for the display command input using the plurality of data points, maintaining the calibration information in a data storage element, and automatically adjusting operation of the component based on a subsequent state of the display command input to the component in accordance with the calibration information.

An embodiment for a line-replaceable unit (LRU) suitable for use in a vehicle includes a display driver to be coupled to a display command bus, a data storage element maintaining calibration information for the display driver, and a control module coupled to the display driver and the data storage element to identify a current state of an input command signal from the display command bus, identify an adjustment for the display driver based on the calibration information using the current state of the input command signal, and automatically operate the display driver in accordance with the adjustment.

BRIEF DESCRIPTION OF THE DRAWINGS

Embodiments of the subject matter will hereinafter be described in conjunction with the following drawing figures, wherein like numerals denote like elements, and.

DETAILED DESCRIPTION

Figure 1:
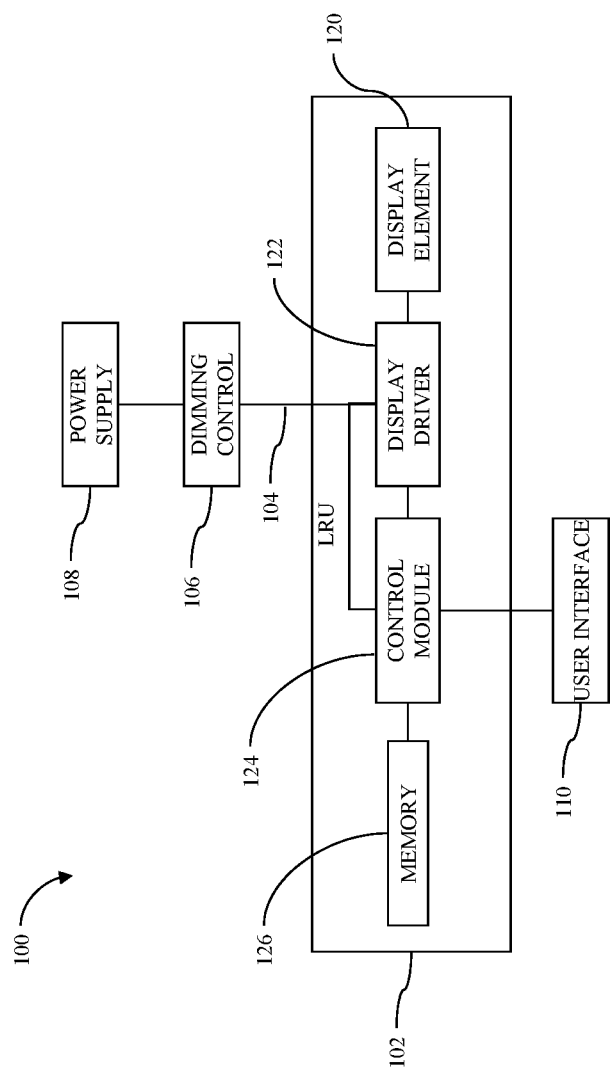
FIG. 1 is a block diagram of a vehicle system in an exemplary embodiment.

Embodiments of the subject matter described herein generally relate to systems and methods for harmonizing the display output by components onboard a vehicle for purposes of night vision operation. For example, a vehicle may include any number of onboard components, which may be manufactured by any number of different manufacturers. When different onboard components are connected to a common dimming command bus, each component may respond to changes to the dimming command (e.g., changes in the input voltage, input current, or the like) in a different manner relative to other components. This may be further exacerbated by the variations between different backlight sources or technologies that employ different driving mechanisms which exhibit different flux characteristics with respect to voltage and/or current, for example, incandescent or compact fluorescents may exhibit nonlinearities while light emitting diodes (LEDs) may behave linearly. Additionally, component aging along with voltage drops, noise, or other disturbances or variations with respect to the different signal paths from the dimming command bus to the respective components may further complicate the task of integrating multiple onboard components and achieving a common display output behavior across all components using a common dimming command bus. As a result, an excessive display output from an onboard component within the field of view of a vehicle operator wearing night vision goggles or similar equipment can saturate or otherwise impair the night vision, and thereby undesirably effect operation of the vehicle.

As described in greater detail below, embodiments of the subject matter described herein facilitates harmonizing display output by using curve fitting to determine calibration information for a display driver of a vehicle component, which, in turn can be utilized across other instances of the vehicle component across a fleet of similarly configured vehicles. For example, an output display characteristic (e.g., luminance, brightness, spectral characteristics, and/or the like) is measured or otherwise obtained for different settings or signal levels for the dimming command provided via the dimming command bus, resulting in uncompensated or uncalibrated display output values for different dimming command settings. For each dimming command setting, a corresponding adjustment to the respective uncompensated or uncalibrated display output value for achieving the desired output display characteristic at that respective dimming command setting for harmonizing with other onboard components is identified. Based on the relationships between the different dimming command settings and the desired output display characteristic adjustments, calibration information for the component across the full range of settings or signal levels for the dimming command bus may be determined using a curve fitting technique (e.g., linear interpolation and/or extrapolation, quadratic or polynomial curve fitting, and/or the like).

The calibration information may be stored or otherwise maintained locally at the vehicle component to facilitate automatically adjusting operation of its display driver(s) based on the state of the input dimming command in accordance with the calibration information to achieve a desired output display characteristic for that dimming command state. In this regard, the calibration information accounts for the performance characteristics or variations associated with the display element(s) or driver arrangement(s) of the onboard component with respect to the dimming command state while also compensating for variations in the signal path associated with the display element(s) and/or driver arrangement(s) without requiring any additional hardware. The calibration information may also be uploaded, offloaded, transmitted, or otherwise provided to other instances of the vehicle component deployed onboard other similarly configured vehicles. In this regard, the calibration information may be stored on a removeable data storage for loading onto other instances of the vehicle component.

By virtue of the subject matter described herein, a vehicle component may be integrated into an onboard environment and have its display behavior for night vision operation harmonized with respect to other components on a common dimming command bus independent of manufacturer, lighting technology, wiring configuration, and/or the like. It should be noted the subject matter described herein can be implemented in the context of any type of dimming command (e.g., voltage-based, current-based, frequency-based, PWM-based, and/or the like). As a result, a harmonized night vision onboard environment can be achieved with reduced costs or manual overhead, and moreover, can be readily deployed across a fleet of similarly-configured vehicles without duplicative efforts. While the subject matter described herein may be implemented in the context of any number of different types of components for any number of different types of vehicles, for purposes of explanation, the subject matter is described herein primarily in the context of line-replaceable units (LRUs) having corresponding display elements within the cockpit of an aircraft.

FIG. 1 depicts an exemplary embodiment of an aircraft system 100 including a line-replaceable unit (LRU) 102 having one or more display element(s) 120 that may be harmonized with display elements of other components onboard the aircraft that are coupled to a common dimming command bus 104 as described herein. It should be appreciated that FIG. 1 depicts a simplified representation of the system 100 for purposes of explanation and ease of description, and FIG. 1 is not intended to limit the application or scope of the subject matter described herein in any way. In this regard, although FIG. 1 shows a single LRU 102, in practice, any number of additional LRUs may be coupled to the dimming command bus 104, as will be appreciated in the art. Furthermore, practical embodiments of the system 100 may include numerous other devices and components for providing additional functions and features, as will be appreciated in the art.

The dimming command bus 104 generally represents the communications bus, wiring, or other communications medium utilize to distribute a dimming command signal to multiple LRUs onboard the aircraft. The dimming control arrangement 106 generally represents the hardware, circuitry, logic, software, firmware, and/or the like that is coupled between a power supply 108 and the dimming command bus 104 and configured to generate or otherwise produce a dimming command signal having an electrical characteristic or state corresponding to a state of a user interface associated therewith. For example, the dimming control arrangement 106 may include or otherwise be associated with a knob, switch, or the like that is adjustable through a range of potential states corresponding to different dimming settings, with the dimming control arrangement 106 varying a signal level, a signal frequency, or other characteristic of the electrical signal provided on the dimming command bus 104 to provide a dimming command state corresponding to the state of the user interface.

The display element 120 may be realized as any sort of electronic display or light source utilized to depict information to a pilot, co-pilot, or other user onboard the aircraft. For example, the display element 120 could include or otherwise be realized as a liquid crystal display (LCD), a light emitting diode (LED) display, an organic light emitting diode (OLED) display, an electrophoretic display, a fluorescent display, an incandescent display, or another electronic display capable of presenting images under control of a processing module (e.g., a processor, controller, or the like). In yet other embodiments, the display element 120 may function as a backlight or frontlight for illuminating information depicted by or on another element. For example, the display element 120 could function as a backlight for one or more annunciator keys, an annunciator panel, and/or the like.

The display driver arrangement 122 generally represents the circuitry, logic, and/or other hardware and/or firmware that is coupled to the dimming command bus 104 between the dimming command bus 104 and the display element 120 to control or otherwise regulate one or more electrical characteristics of the input dimming command signal received from the dimming command bus 104 to generate a corresponding dimming command that is applied or otherwise provided to the display element 120. In this regard, operation of the display driver arrangement 122 may be adjusted or otherwise altered to produce a corresponding adjustment to the relationship between one or more electrical characteristics of the dimming command relative to the electrical characteristic(s) of the input dimming command signal to produce a corresponding adjustment to a display characteristic of the display element 120. For example, the control module 124 may adjust operation of the display driver arrangement 122 to increase or decrease a gain provided by the display driver arrangement 122 to produce a corresponding increase or decrease in the voltage level of the output dimming command signal provided to the display element 120 for a given voltage level of the input dimming command signal to thereby increase or decrease the brightness of the display element 120 for that input dimming command state. As described in greater detail below, in exemplary embodiments, calibration information including different adjustments to the display driver arrangement 122 for different states of the input dimming command signal to harmonize the display characteristic(s) of the display element 120 with other onboard components coupled to the dimming command bus 104 (e.g., by increasing or decreasing the display driver gain at different input command states) are utilized to automatically adjust or otherwise alter operation of the display driver arrangement 122 in real-time as a user adjusts the input dimming command signal (e.g., via dimming control arrangement 106) throughout its defined signal range to maintain harmonization of the display characteristic(s) throughout the range of the input dimming command signal.

The control module 124 generally represents the hardware, circuitry, processing logic, and/or other components of the LRU 102 that are configured to control operation of the display driver arrangement 122 in accordance with calibration information for the LRU 102 to harmonize the display output generated by the display element 120 with other onboard components, as described in greater detail below. Depending on the embodiment, the control module 124 may be implemented or realized with a general purpose processor, a controller, a microprocessor, a microcontroller, a content addressable memory, a digital signal processor, an application specific integrated circuit, a field programmable gate array, any suitable programmable logic device, discrete gate or transistor logic, processing core, discrete hardware components, or any combination thereof, designed to perform the functions described herein. The data storage element 126 (or memory) generally represents any sort of memory or other computer-readable medium (e.g., RAM memory, ROM memory, flash memory, registers, a hard disk, or another suitable non-transitory short- or long-term storage media), which is capable of storing computer-executable programming instructions or other data for execution that, when read and executed by the control module 124, cause the control module 124 to execute and perform one or more of the processes tasks, operations, and/or functions described herein.

In exemplary embodiments, a user interface 110 is coupled to the control module 124 of the LRU 102 to allow a user to interact with the LRU 102. The user interface may be realized as a keypad, touchpad, keyboard, mouse, touch panel, joystick, knob, line select key or another suitable device adapted to receive input from a user. In exemplary embodiments, the user interface may be incorporated into or otherwise integrated with the LRU 102, while in other embodiments, the user interface 110 may be separate from the LRU 102 and communicatively coupled to the control module 124 (e.g., via wiring, a wireless network, and/or the like).

Figure 2:
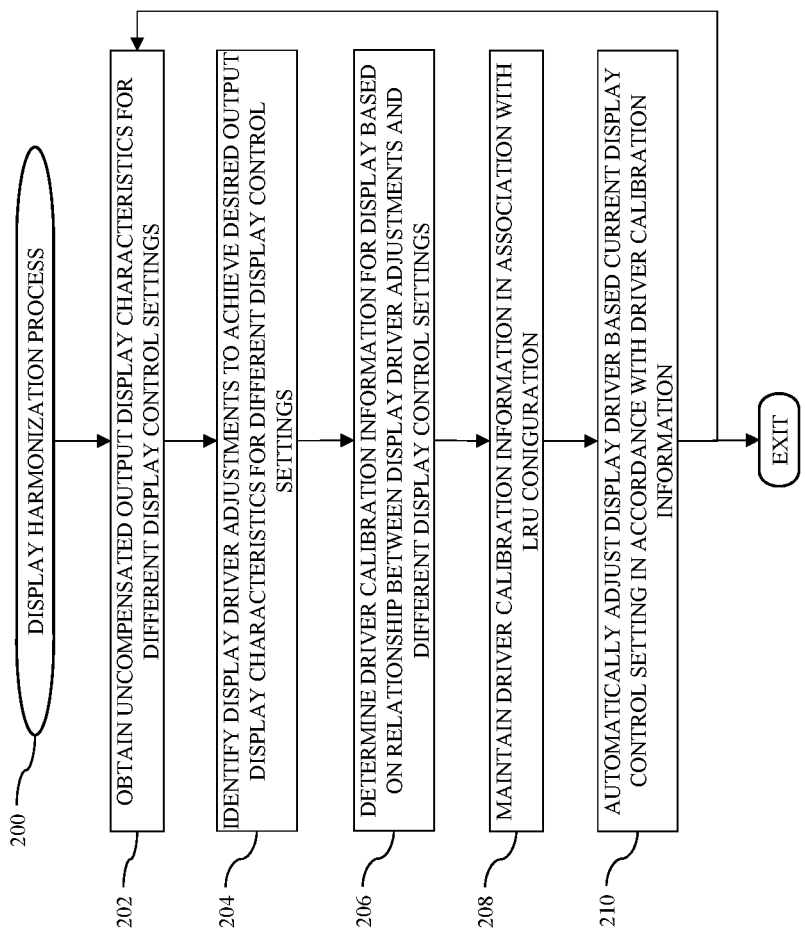
FIG. 2 is a flow diagram of an exemplary display harmonization process suitable for use with the vehicle system of FIG. 1 in accordance with one or more embodiments.

FIG. 2 depicts an exemplary embodiment of a display harmonization process 200 suitable for use with the LRU 102 of FIG. 1 to harmonize one or more display characteristics of the output generated by the display element 120 with respect to other onboard components coupled to the dimming command bus 104. The various tasks performed in connection with the illustrated process 200 may be implemented using hardware, firmware, software executed by processing circuitry, or any combination thereof. For illustrative purposes, the following description may refer to elements mentioned above in connection with FIG. 1. In practice, portions of the display harmonization process 200 may be performed by different elements of the system 100, however, exemplary embodiments may be described herein as primarily being performed by the control module 124. It should be appreciated that the display harmonization process 200 may include any number of additional or alternative tasks, the tasks need not be performed in the illustrated order and/or the tasks may be performed concurrently, and/or the display harmonization process 200 may be incorporated into a more comprehensive procedure or process having additional functionality not described in detail herein. Moreover, one or more of the tasks shown and described in the context of FIG. 2 could be omitted from a practical embodiment of the display harmonization process 200 as long as the intended overall functionality remains intact.

The display harmonization process 200 identifies or otherwise obtains uncompensated values for an output display characteristic of the display element for different display control settings and identifies or otherwise determines corresponding adjustments to the uncompensated values to achieve the desired output display characteristic for the different display control settings (tasks 202, 204). In this regard, the display harmonization process 200 captures or otherwise identifies a set of data points that may be utilized to determine calibration information for the LRU 102 using curve fitting. For example, a user may operate the dimming control 106 to set the state of the dimming command signal provided on the dimming command bus 104 to a reference level for the dimming command signal (e.g., a dimming control setting of 10% of the range for the dimming command signal). While the dimming command signal is maintained at that state by the dimming control 106, the display driver 122 at the LRU 102 may provide a corresponding command signal level or state to the display element 120 to generate a reference output for that dimming control setting. A measured value for the display characteristic of interest (e.g., a brightness, a luminance, a spectral characteristic, and/or the like) may be obtained by or at the LRU 102 or via some other measurement arrangement possessed or operated by the user. Thereafter, the user may operate the user interface 110 to input or otherwise provide an indication of the desired value for the display characteristic of interest at that dimming command setting (e.g., to harmonize the display output by LRU 102 with other LRUs coupled to the shared dimming command bus 104 at that particular setting), which, in turn, may be utilized by the control module 124 to determine a corresponding adjustment to operation of the display driver 122 to achieve the desired output display characteristic at that respective dimming control setting. That said, in other embodiments, the user may operate the user interface 110 to manually adjust the operation of the display driver 122 via the control module 124. The control module 124 may store or otherwise maintain (e.g., in memory 126) the measured uncompensated value for the display characteristic in association with the dimming control setting (or state) along with the desired value for the display characteristic (or the desired adjustment to the display driver 122) associated with that dimming control setting (or state).

After obtaining an initial data point for calibrating the LRU 102, the user may operate the dimming control 106 to set the state of the dimming command signal provided on the dimming command bus 104 to a different reference level for the dimming command signal (e.g., a dimming control setting of 50%). In a similar manner as described above, the display driver 122 at the LRU 102 may provide a corresponding command signal level or state to the display element 120 to generate a reference output for that new dimming control setting, and a measured value for the display characteristic of interest may be obtained. Thereafter, the user may operate the user interface 110 to input or otherwise provide an indication of the desired value for the display characteristic of interest at that new dimming command setting, which, in turn, may be utilized by the control module 124 to determine a corresponding adjustment to operation of the display driver 122 to achieve the desired output display characteristic at that respective dimming control setting, or alternatively, the user may operate the user interface 110 to manually adjust the operation of the display driver 122 via the control module 124 until achieving the desired output display characteristic. The control module 124 similarly stores or otherwise maintains (e.g., in memory 126) the measured uncompensated value for the display characteristic in association with the updated dimming control setting (or state) along with the desired value for the display characteristic (or the desired adjustment to the output provided by the display driver 122) associated with that dimming control setting (or state). In this regard, the user may operate the dimming control 106 to sequentially vary the state of the dimming command signal and provide corresponding input for adjusting the uncompensated output display characteristic of the display element 120 to achieve a desired output display characteristic at the respective dimming command signal states, resulting in a set of data points that relate the dimming command signal state to the corresponding amount of adjustment to the display driver 122 required to harmonize the display element 120 and achieve the desired output display characteristic depending on the dimming command signal state received from the dimming command bus 104 at the input to the display driver 122.

In other embodiments, tasks 202 and 204 may be automated by automatically sweeping the dimming command signal through a sequence of dimming command signal states, automatically measuring the resulting uncompensated output display characteristics, and automatically determining the corresponding adjustments to the display driver 122 to achieve desired output display characteristics for the respective dimming command signal states based on the measured uncompensated values for the output display characteristic at the respective dimming command signal states.

After identifying or otherwise obtaining indicia of the display driver adjustments for different display control settings, the display harmonization process 200 calculates or otherwise determines calibration information for the display driver across the full range of potential display control states based on the relationship between the previously-obtained display driver adjustments for different reference display control settings (task 206). In this regard, the control module 124 utilizes a curve fitting technique to interpolate and/or extrapolate display driver adjustments for intermediary and/or edge dimming command states that were not tested or analyzed during the preceding data collection (e.g., task 202, 204). Thus, rather than manually calibrating the LRU 102 for every possible dimming command state, a smaller subset of calibration data points may be obtained and utilized to generate calibration information for the full range of possible dimming command states, thereby reducing the amount of manual overhead required. In some embodiments, the user may input or otherwise identify the desired curve fitting technique to be utilized. In other embodiments, the display harmonization process 200 may automatically determine the curve fitting technique to be utilized. For example, in some embodiments, the display harmonization process 200 may utilize a r-squared value, a cost function, or the like to identify which curve fitting technique best fits the previously-obtained data points and then select that curve fitting technique for use in generating the calibration information. In other embodiments, the display harmonization process 200 may automatically identify the curve fitting technique based on the display technology associated with the display element 120 and/or the display driver 122. For example, for LED technology, the display harmonization process 200 may utilize a linear curve fitting technique, while a quadratic or other polynomial or nonlinear curve fitting is performed when the display element 120 includes an incandescent or fluorescent lighting element.

In exemplary embodiments, the display harmonization process 200 stores or otherwise maintains the calibration information in association with the current LRU configuration (task 208). In exemplary embodiments, the calibration information is stored or otherwise maintained in the memory 126 for subsequent utilization by the control module 124 when the LRU 102 is configured with the same type of display element 120 and/or display driver 122. In various embodiments, the calibration information may also be stored on a removeable data storage element (e.g., a flash drive or the like) that may be inserted into the LRU 102 and then removed and subsequently inserted into another instance of a similarly configured LRU to automatically store or load the calibration information onto that other instance of the LRU without requiring any manual calibration steps (e.g., tasks 202 and 204) to be performed with other instances of the LRU. In yet other embodiments, the calibration information may be uploaded, transmitted, or otherwise provided to any number of remote or external devices via a wireless network, a wired network, or any other sort of communications network, thereby allowing the calibration information to be distributed across multiple instances of similarly configured LRUs.

After the calibration information is determined, the display harmonization process 200 continues by automatically adjusting the display driver based on the current display control setting in accordance with the calibration information to achieve a harmonized display output (task 210). In this regard, the control module 124 is coupled to the dimming command bus 104 and/or the input to the display driver 122 to monitor the state of the input dimming command signal. Based on the state of the input dimming command signal, the control module 124 utilizes the calibration information maintained in the memory 126 to determine an appropriate adjustment to the display driver 122 to achieve the desired output display characteristic for the current dimming command setting. For example, the control module 124 may utilize the current input dimming command state to identify the appropriate calibration adjustment to the display driver to achieve the desired output display characteristic for the current dimming command state. In this regard, when the current input dimming command state does not correspond to one of the previously-calibrated reference states (e.g., from tasks 202 and 204), the control module 124 utilizes the display driver adjustment determined using curve fitting to adjust the manner in which the display driver 122 is operated to increase, decrease, or otherwise adjust the state of the dimming command signals provided to the display element 120 relative to the input dimming command signal received from the dimming command bus 104 so that the resulting output display characteristics are harmonized with other onboard components.

For purposes of explanation, an exemplary sequence of interactions with an LRU, such as LRU 102, to provide calibration data points for calibrating the LRU in connection with the display harmonization process 200 of FIG. 2 will now be described. In this regard, a user may interact with an LRU 102 by manipulating the user interface 110 to initiate the display harmonization process 200 at the LRU 102. In response, the LRU 102 may generate or otherwise provide a prompt on the display element 120 for the user to set the dimming command control 106 to the minimum dimming state. After the user sets the dimming command control 106 to the minimum dimming level, the user may interact with the user interface 110 to confirm or otherwise indicate the dimming command is at its minimum level. In response, the LRU 102 may measure or otherwise obtain the input dimming command state (e.g., the measured input voltage) and the resulting output display characteristic (e.g., the measured brightness). Thereafter, the user may manipulate the user interface 110 to increase or decrease the brightness of the display element 120 at that minimum dimming command setting, with the control module 124 determining the corresponding adjustment for the display driver 122 and operating the display driver 122 accordingly until the resulting brightness of the display element 120 corresponds to the user's desired minimum brightness. Once the adjusted brightness corresponds to the desired brightness, the user may manipulate the user interface 110 of the LRU 102 to set or otherwise store the measured input dimming command voltage, the measured uncompensated output brightness, and the desired display driver command adjustment for achieving the desired output brightness in the memory 126 for use as the minimum dimming command calibration data point.

The LRU 102 may then generate or otherwise provide a prompt on the display element 120 for the user to set the dimming command control 106 to the maximum input state. After the user sets the dimming command control 106 to the maximum dimming level, the user may similarly interact with the user interface 110 to confirm or otherwise indicate the dimming command is at its maximum level. The LRU 102 then measures or otherwise obtains the input dimming command voltage and the resulting brightness output by the display element 120. The user may then manipulate the user interface 110 to increase or decrease the brightness of the display element 120 at that maximum dimming command setting, with the control module 124 determining the corresponding adjustment for the display driver 122 and operating the display driver 122 accordingly until the resulting brightness of the display element 120 corresponds to the user's desired maximum brightness. Once the adjusted brightness corresponds to the desired maximum brightness, the user may manipulate the user interface 110 of the LRU 102 to set or otherwise store the measured input dimming command voltage, the measured uncompensated output brightness, and the desired display driver command adjustment for achieving the desired output brightness in the memory 126 for use as the maximum dimming command calibration data point.

Depending on the embodiment, the user may interact with the user interface 110 of the LRU 102 to define intermediary calibration data points and corresponding display driver adjustments for achieving a harmonized display output between the minimum and maximum dimming command states as desired by the user. Thereafter, the user may interact with the user interface 110 of the LRU 102 to set or otherwise define the type of curve fitting the user would like to use for calibrating and harmonizing the display output of the LRU 102 throughout the dimming command range between the minimum and maximum dimming command states. In response to setting quadratic as the desired curve fitting technique, the control module 124 performs a quadratic curve fit on the obtained calibration data points to generate calibration information in the form of a lookup table for display driver adjustments for the LRU 102 as desired incremental dimming command states throughout the dimming command range and stores or otherwise maintains the display driver adjustment lookup table in the memory 126. Thereafter, the control module 124 may measure or otherwise monitor the input dimming command voltage received from the dimming command bus 104 at the input to the display driver 122, obtain the corresponding display driver adjustment for that input dimming command voltage from the lookup table in the memory 126, then adjust or otherwise alter operation of the display driver 122 in accordance with that display driver adjustment to achieve the desired display brightness at that dimming command state.

It should be appreciated that the subject matter described herein eliminates the need for any centralized or unified control system or other external dependencies for harmonizing an LRU with other onboard LRUs. Rather, the LRU is independently configurable to provide a federated system where the individual LRUs can be directly connected to the dimming command bus and independently configured for harmonization without reliance on any intermediary or intervening components or systems that tune the signal input to the LRU. Additionally, the calibration information from one instance of an LRU is portable and may be transmitted or otherwise transferred to other instances of the LRU onboard other vehicles to facilitate harmonization of that LRU with existing LRUs across a fleet of similarly configured vehicles, thereby reducing the amount of time required for deploying and integrating a new LRU across a fleet of vehicles having existing LRUs that are already harmonized.

For the sake of brevity, conventional techniques related to electronic displays, cockpit displays, avionics, LRUs, curve fitting, night vision, and other aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

The subject matter may be described herein in terms of functional and/or logical block components, and with reference to symbolic representations of operations, processing tasks, and functions that may be performed by various computing components or devices. It should be appreciated that the various block components shown in the figures may be realized by any number of hardware components configured to perform the specified functions. For example, an embodiment of a system or a component may employ various integrated circuit components, e.g., memory elements, digital signal processing elements, logic elements, lookup tables, or the like, which may carry out a variety of functions under the control of one or more microprocessors or other control devices. Furthermore, embodiments of the subject matter described herein can be stored on, encoded on, or otherwise embodied by any suitable non-transitory computer-readable medium as computer-executable instructions or data stored thereon that, when executed (e.g., by a processing system), facilitate the processes described above.

The foregoing description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the drawings may depict one exemplary arrangement of elements directly connected to one another, additional intervening elements, devices, features, or components may be present in an embodiment of the depicted subject matter. In addition, certain terminology may also be used herein for the purpose of reference only, and thus are not intended to be limiting.

The foregoing detailed description is merely exemplary in nature and is not intended to limit the subject matter of the application and uses thereof. Furthermore, there is no intention to be bound by any theory presented in the preceding background, brief summary, or the detailed description.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the subject matter in any way. Rather, the foregoing detailed description will provide those skilled in the art with a convenient road map for implementing an exemplary embodiment of the subject matter. It should be understood that various changes may be made in the function and arrangement of elements described in an exemplary embodiment without departing from the scope of the subject matter as set forth in the appended claims. Accordingly, details of the exemplary embodiments or other limitations described above should not be read into the claims absent a clear intention to the contrary.

What is claimed is:

1. A method of harmonizing a display characteristic of a line-replaceable unit (LRU) onboard a vehicle with other components onboard the vehicle coupled to a common command bus, the LRU comprising a display element and a display driver coupled between the common command bus and the display element, the method comprising:
    obtaining adjustments to a relationship between one or more electrical characteristics of an output dimming command relative to the one or more electrical characteristics of a display command input from the common command bus to achieve a desired output display characteristic of the display element at different states of the display command input, resulting in a plurality of data points maintaining associations between a respective adjustment and a respective state for the display command input;
    determining calibration information for a range of the display command input based on relationships between the respective adjustments and the respective different states for the display command input using the plurality of data points;
    maintaining the calibration information in a data storage element of the LRU coupled to a control module of the LRU; and
    automatically adjusting, by the control module, operation of the display driver of the LRU to translate a subsequent state of the display command input to the LRU into a corresponding output dimming command provided to the display element in accordance with a subset of the calibration information associated with the subsequent state of the display command input.

2. The method of claim 1, wherein the output display characteristic comprises at least one of a brightness, a luminance, and a spectral characteristic.

3. The method of claim 1, wherein determining the calibration information comprises performing a curve fitting technique on the plurality of data points to obtain respective adjustments to the display driver for respective states of the display command input throughout the range of the display command input.

4. The method of claim 3, further comprising automatically identifying the curve fitting technique based on the plurality of data points.

5. The method of claim 1, wherein the common command bus comprises a dimming command bus.

6. The method of claim 1, wherein the calibration information harmonizes the display characteristic of the LRU onboard the vehicle with the other components for purposes of night vision operation.

7. The method of claim 1, further comprising transmitting the calibration information to a second LRU onboard another vehicle, wherein a second control module of the second LRU automatically adjusts operation of a second display driver of the second LRU in accordance with the calibration information obtained from the LRU.

8. The method of claim 1, further comprising transferring the calibration information to a second data storage element of a second LRU onboard another vehicle, wherein a second control module of the second LRU automatically adjusts operation of a second display driver of the second LRU in accordance with the calibration information obtained from the LRU.

9. The method of claim 1, wherein automatically adjusting operation of the display driver comprises automatically increasing or decreasing a gain of the display driver of the LRU to produce a corresponding increase or decrease in the corresponding output dimming command for the subsequent state of the display command input to the LRU.

10. The method of claim 1, wherein automatically adjusting operation of the display driver of the LRU comprises automatically increasing or decreasing display driver gain at different input command states in real-time as a user adjusts the display command input.

11. The method of claim 1, wherein automatically adjusting operation of the display driver of the LRU comprises automatically adjusting display driver gain at different input command states in a quadratic, polynomial or nonlinear manner as a user adjusts the display command input throughout a range of the display command input.

12. The method of claim 1, wherein automatically adjusting operation of the display driver of the LRU comprises increasing or decreasing a gain provided by the display driver to produce a corresponding increase or decrease in a voltage level of an output dimming command signal provided to the display element for a given voltage level of an input dimming command signal to thereby increase or decrease a brightness of the display element for that state of the input dimming command signal.

13. A line-replaceable unit (LRU) suitable for use in a vehicle, the LRU comprising:
    a display driver to be coupled to a display command bus;
    a data storage element to maintain calibration information for the display driver; and
    a control module coupled to the display driver and the data storage element to identify a current state of an input command signal from the display command bus, identify an adjustment to a relationship between one or more electrical characteristics of an output dimming command from the display driver relative to the one or more electrical characteristics of the input command signal to the display driver based on the calibration information using the current state of the input command signal, and automatically operate the display driver in accordance with the adjustment to translate the current state of the input command signal into the output dimming command to be provided to a display element in accordance with a subset of the calibration information associated with the current state of the input command signal.

14. The LRU of claim 13, wherein the adjustment adjusts or alters the one or more electrical characteristics of the output dimming command provided to the display element relative to the one or more electrical characteristics of the input command signal.

15. The LRU of claim 14, wherein the display command bus comprises a dimming command bus.

16. The LRU of claim 13, wherein the display command bus comprises a dimming command bus.

17. A non-transitory computer-readable medium having computer-executable instructions stored thereon that, when read and executed by a processor, cause the processor to:
obtain adjustments to a relationship between one or more electrical characteristics of an output dimming command relative to the one or more electrical characteristics of a display command input from a common command bus coupled to a line-replaceable unit (LRU) to achieve a desired output display characteristic of a display element of the LRU at different states of the display command input from the common command bus, resulting in a plurality of data points maintaining associations between a respective adjustment and a respective state for the display command input;
determine calibration information for a range of the display command input based on relationships between the respective adjustments and the respective different states for the display command input using the plurality of data points;
maintain the calibration information in a data storage element of the LRU coupled to a control module of the LRU; and
automatically adjust, by the control module of the LRU, operation of a display driver of the LRU to translate a subsequent state of the display command input to the LRU into a corresponding output dimming command provided to the display element in accordance with a subset of the calibration information associated with the subsequent state of the display command input, wherein the display driver is coupled between the common command bus and the display element.

18. The non-transitory computer-readable medium of claim 17, wherein automatically adjusting the operation of the display driver comprises automatically increasing or decreasing a gain of the display driver based at least in part on the subsequent state of the display command input.

19. The non-transitory computer-readable medium of claim 17, wherein automatically adjusting the operation of the display driver comprises increasing or decreasing a gain provided by the display driver to produce a corresponding increase or decrease in a voltage level of an output dimming command signal provided to the display element for a given voltage level of an input dimming command signal to thereby increase or decrease a brightness of the display element for that state of the input dimming command signal.

20. The non-transitory computer-readable medium of claim 17, wherein the common command bus comprises a dimming command bus.

* * * * *